(12) United States Patent
Li

(10) Patent No.: US 7,446,399 B1
(45) Date of Patent: Nov. 4, 2008

(54) PAD STRUCTURES TO IMPROVE BOARD-LEVEL RELIABILITY OF SOLDER-ON-PAD BGA STRUCTURES

(75) Inventor: Yuan Li, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 174 days.

(21) Appl. No.: 10/911,088

(22) Filed: Aug. 4, 2004

(51) Int. Cl.
*H01L 23/48* (2006.01)
*H01L 23/02* (2006.01)
*H01L 21/00* (2006.01)

(52) U.S. Cl. .................. 257/669; 257/674; 257/784; 438/119; 438/646; 438/612

(58) Field of Classification Search ............... 257/669, 257/674, 784, E23.161, E23.021, E2.181, 257/E22.021; 438/119, 646, 612
See application file for complete search history.

(56) References Cited

U.S. PATENT DOCUMENTS

| | | | |
|---|---|---|---|
| 3,462,349 A | 8/1969 | Gorgenyi | |
| 3,541,222 A | 11/1970 | Parks et al. | |
| 4,652,336 A | 3/1987 | Andrascek et al. | |
| 4,830,264 A | 5/1989 | Bitaillou et al. | |
| 5,053,851 A | 10/1991 | Berndlmaier et al. | |
| 5,059,553 A | 10/1991 | Berndlmaier et al. | |
| 5,203,075 A | 4/1993 | Angulas et al. | |
| 5,260,518 A | 11/1993 | Tanaka et al. | |
| 5,261,593 A | 11/1993 | Casson et al. | |
| 5,317,801 A | 6/1994 | Tanaka et al. | |
| 5,401,913 A | 3/1995 | Gerber et al. | |
| 5,491,303 A | 2/1996 | Weiss | |
| 5,600,884 A | 2/1997 | Kondo et al. | |
| 5,648,686 A | 7/1997 | Hirano et al. | |
| 5,663,594 A | 9/1997 | Kimura | |
| 5,726,497 A | 3/1998 | Chao et al. | |
| 5,757,078 A | 5/1998 | Matsuda et al. | |
| 5,783,868 A * | 7/1998 | Galloway | 257/784 |
| 5,872,399 A | 2/1999 | Lee | |
| 5,943,597 A | 8/1999 | Kleffner et al. | |
| 6,198,169 B1 | 3/2001 | Kobayashi et al. | |
| 6,245,594 B1 | 6/2001 | Wu et al. | |
| 6,303,985 B1 * | 10/2001 | Larson et al. | 257/676 |
| 6,306,750 B1 * | 10/2001 | Huang et al. | 438/612 |
| 6,329,722 B1 * | 12/2001 | Shih et al. | 257/786 |
| 6,400,018 B2 | 6/2002 | Clatanoff et al. | |
| 6,434,817 B1 * | 8/2002 | Feigenbaum et al. | 29/840 |
| 6,462,414 B1 | 10/2002 | Anderson | |

(Continued)

FOREIGN PATENT DOCUMENTS

DE 19702014 A1 4/1998

(Continued)

*Primary Examiner*—Howard Weiss
*Assistant Examiner*—Steven H Rao
(74) *Attorney, Agent, or Firm*—Morgan, Lewis & Bockius LLP; Francis E. Morris

(57) ABSTRACT

The present invention is directed to a new bonding pad structure having a rugged contact interface that makes it more difficult for a crack to grow from the peripheral edge of the bonding pad. The rugged contact interface also helps to accumulate more solder paste on the edge of the bonding pad, increase the thickness of the solder layer near the pad edge and prevent the pad edge from being oxidized and turning into a crack initiation point.

15 Claims, 8 Drawing Sheets

U.S. PATENT DOCUMENTS

| | | | |
|---|---|---|---|
| 6,596,560 B1 * | 7/2003 | Hsu | 438/108 |
| 6,762,503 B2 * | 7/2004 | Lee | 257/781 |
| 6,794,745 B1 * | 9/2004 | Lee | 257/692 |
| 6,872,465 B2 * | 3/2005 | Soga et al. | 428/570 |
| 6,906,417 B2 * | 6/2005 | Jiang et al. | 257/738 |
| 7,012,018 B2 * | 3/2006 | Tellkamp | 438/614 |
| 7,015,580 B2 * | 3/2006 | Fitzsimmons et al. | 257/739 |
| 7,331,106 B2 * | 2/2008 | Workman et al. | 29/840 |
| 2002/0047216 A1 * | 4/2002 | Jiang et al. | 257/778 |
| 2002/0171157 A1 * | 11/2002 | Soga et al. | 257/783 |
| 2003/0119299 A1 * | 6/2003 | Jiang et al. | 438/612 |
| 2006/0097400 A1 * | 5/2006 | Cruz et al. | 257/774 |

FOREIGN PATENT DOCUMENTS

| | | |
|---|---|---|
| EP | 0702404 A2 | 3/1996 |
| EP | 0751565 A2 | 1/1997 |
| JP | 56-66057 A | 6/1981 |
| JP | 1120040 A | 5/1989 |
| JP | 2-288925 | 11/1990 |
| JP | 6-112274 A | 4/1994 |
| JP | 9-266230 A | 10/1997 |
| JP | 2001-351946 A | 12/2001 |
| WO | WO 92/00604 A1 | 1/1992 |
| WO | WO 00/13232 A1 | 3/2000 |

* cited by examiner ously understood hereinafter as a result of a detailed
PAD STRUCTURES TO IMPROVE BOARD-LEVEL RELIABILITY OF SOLDER-ON-PAD BGA STRUCTURES The present invention relates generally to an electronic package and, in particular, to a new bonding pad structure that, after incorporated into a ball grid array (BGA) package, improves the package's board-level reliability (BLR).

BACKGROUND OF THE INVENTION

This relates to electronic packages that contain an integrated circuit (IC) typically fabricated on a semiconductor die. The package protects the IC from the environment and provides I/O interfaces for the IC to communicate with other circuits.

FIG. 1 is a cross-sectional view of a prior art BGA package including a substrate 100 and a semiconductor die 120 on the surface of the substrate 100. The semiconductor die carries an electronic circuit, e.g., a programmable logic device (PLD). The substrate includes a multitude of conductive paths running from a first array of solder joints 130 on one side of the substrate to a second array of solder joints 160 on the other side of the substrate. The first array of solder joints 130 is formed out of an array of solder balls located between the semiconductor die 120 and the substrate 100 after solder reflowing in a high temperature environment, that extends the electronic circuit's I/O structure from the semiconductor die 120 to the substrate 100. An underfill layer 140 is injected into the space between the die 120 and the substrate 100 to prevent or reduce stress concentration at the solder joints. An encapsulant layer 150 may be deployed on the substrate 100 and the semiconductor die 120, further insulating the electronic circuit from the environment. The second array of solder joints 160 is attached to an array of bonding pads 170 on the bottom side of the substrate 100, each solder joint having an associated conductive path in the substrate 100 that connects it to a solder joint on the top side of the substrate 100. A heat spreader 180 may be positioned on top of the encapsulant layer 150 to dissipate the heat generated by the electronic circuit inside the BGA package. In a typical application, multiple BGA packages like the one shown in FIG. 1, each including an electronic circuit designed for certain functions, are attached to a printed wiring board 190 by reflowing the attached solder balls into solder joints in a high temperature environment.

It has been observed that the reliability of a BGA package in an electronic application is significantly limited by the package's board-level reliability, which, in turn, depends on the condition of the connections between the solder joints 160 and the bonding pads 170. FIG. 2A is an enlarged cross-sectional view of a prior art bonding pad structure 200 at the bottom side of a substrate 205 before a solder joint is formed on its surface. The bonding pad structure 200 includes a copper pad 210 that is attached to the bottom side of the substrate 205 through, e.g., copper plating, and a layer of solder mask 240 covering a substantial portion of the bottom side. Note that the solder mask covering the central region of the copper pad 210 has been removed to expose a portion of the pad surface and the exposed pad surface is covered with a thin layer of solder paste 230 to protect it from oxidization. However, the thickness of the solder layer 230 is often non-uniform due to its surface tension, and there is little solder paste near the peripheral edge of the solder mask 233, allowing the copper pad 210 near the solder mask edge to be easily oxidized. As a result, when the solder joint is formed, the oxidized area on the copper pad may not be wetted by molten solder or the molten solder may withdraw from the oxidized area. In this case, even though the solder joint formed on the copper pad is initially connected to the substrate, the oxidized area on the copper pad may become a point at which a crack initiates. Such a crack can grow into a complete disconnection between the solder joint and the substrate during a board-level thermal cycling test.

FIG. 2B schematically illustrates a solder joint 250 that is disconnected from the conventional copper pad 210 by a fully-grown crack 237. The crack 237 starts at the oxidized area near the edge of the solder mask 240, extends into the central region of the copper pad 210 and finally disconnects the solder joint 250 from the copper pad 210, causing an electrical failure in the package which is very difficult to identify in a conventional electrical test.

SUMMARY OF THE INVENTION

The present invention is directed to a bonding pad structure and method for its formation that can effectively avoid the aforementioned problem of a disconnected solder joint caused by copper pad oxidization. An illustrative embodiment of the structure includes a copper pad having a rugged contact interface which is covered with a layer of solder. In some embodiments, another copper layer is attached to the central region of the copper pad, creating a stair-like contact interface. The rugged contact interface makes it more difficult for a crack initiated on the edge of the copper pad to grow when compared with a flat contact interface on a conventional copper pad. The rugged contact interface also helps to accumulate more solder paste on the edge of the copper pad, thereby increasing the thickness of the solder layer near the edge and preventing the copper pad edge from being oxidized and turned into a crack initiation point.

BRIEF DESCRIPTION OF THE DRAWINGS

The aforementioned features and advantages of the invention as well as additional features and advantages thereof will be more clearly understood hereinafter as a result of a detailed description of preferred embodiments of the invention when taken in conjunction with the drawings.

Like reference numerals refer to corresponding parts throughout the several views of the drawings.

DETAILED DESCRIPTION OF THE EMBODIMENTS

Figure 1:
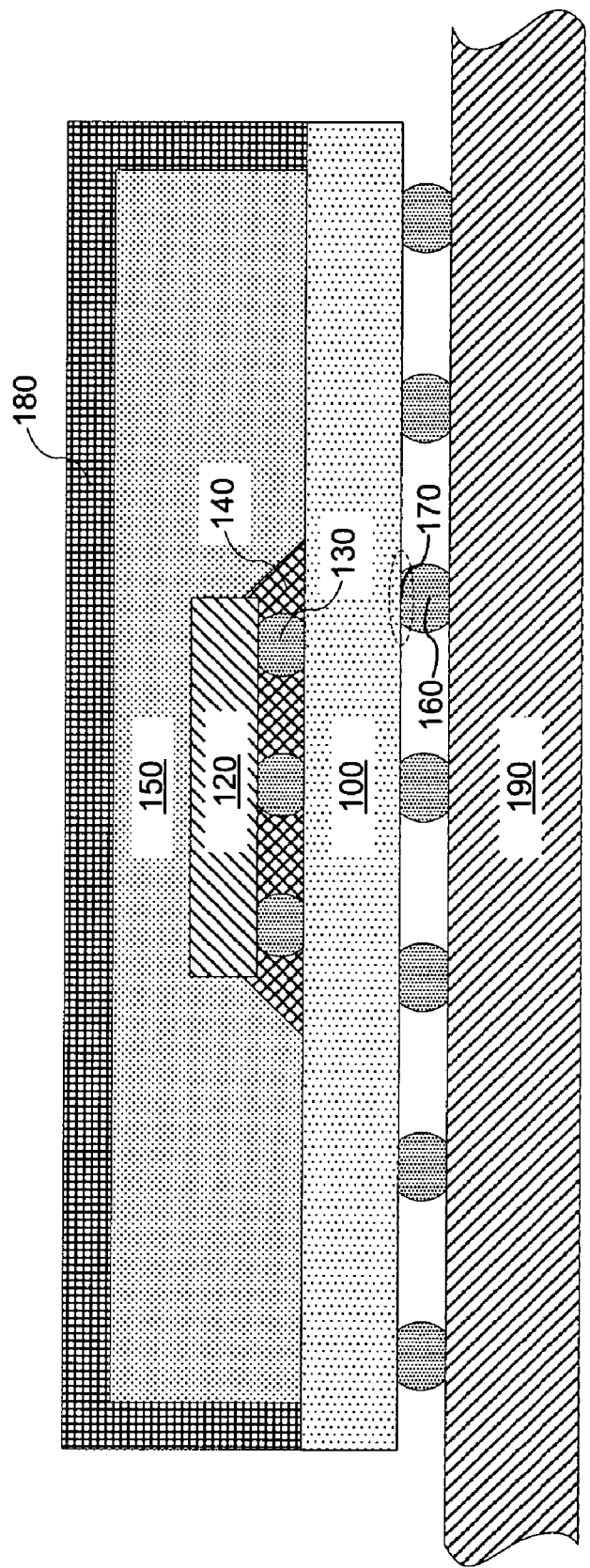
FIG. 1 is a cross-sectional view of a prior art BGA package before it is attached to a printed wiring board.
Figure 2A:
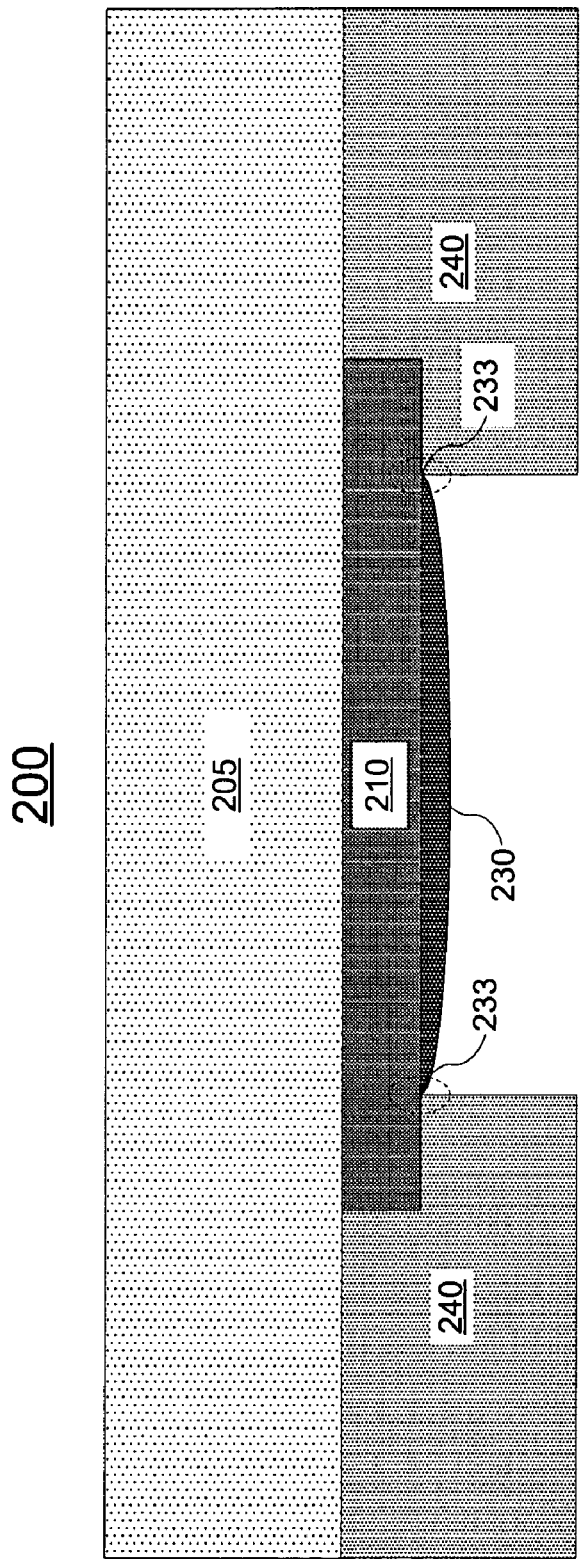
FIGS. 2A and 2B are enlarged cross-sectional views of a prior art bonding pad structure at the bottom side of a substrate before a solder joint is formed on its surface and after the solder joint is disconnected from the bonding pad surface by a fully-grown crack, respectively.
Figure 2B:
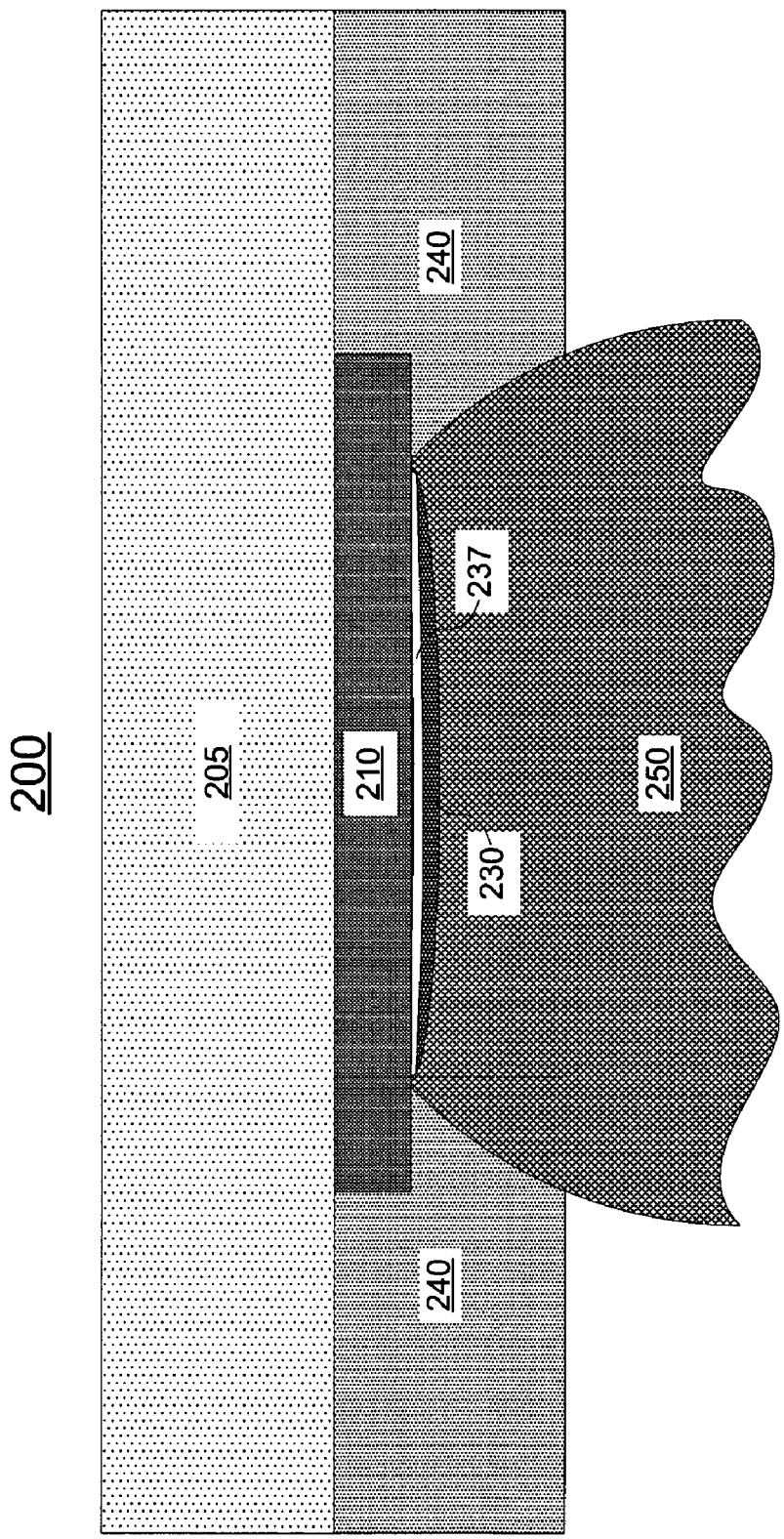
Figure 3A:
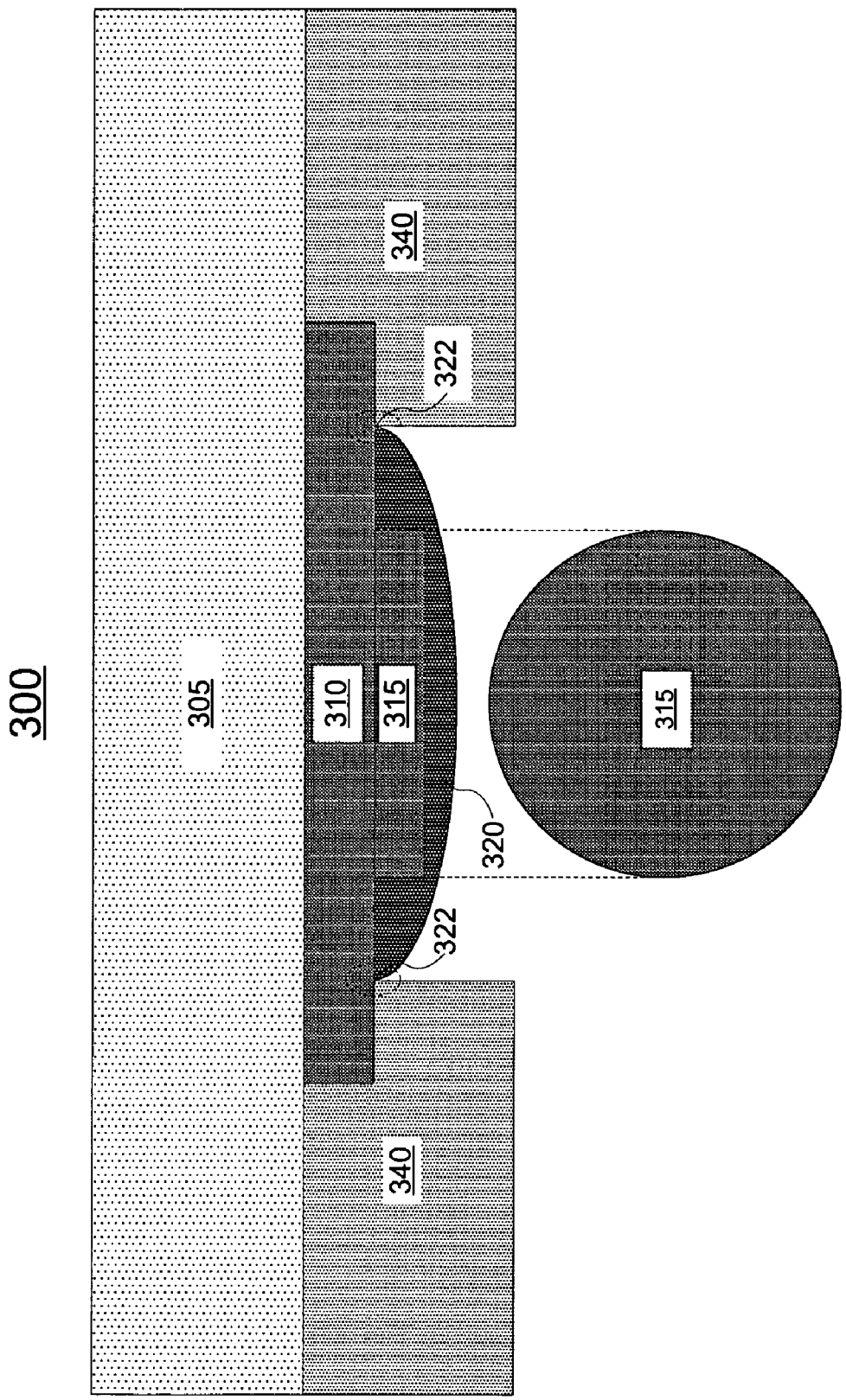
FIGS. 3A and 3B are enlarged cross-sectional views of a bonding pad structure at the bottom side of a substrate according to a first embodiment of the present invention.
Figure 3B:
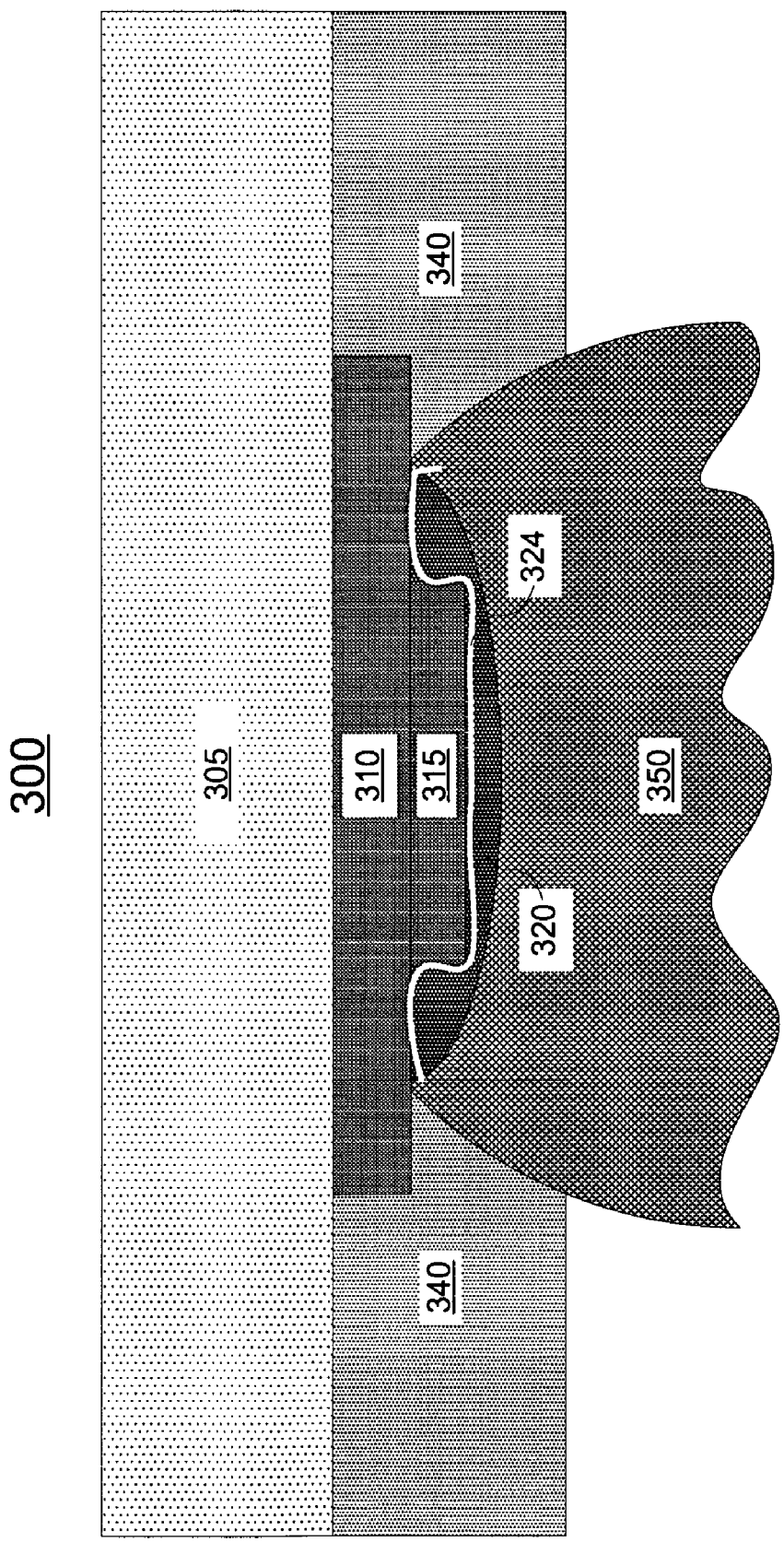

FIG. 3A is an enlarged cross-sectional view of a bonding pad structure 300 at the bottom side of a substrate 305 according to a first embodiment of the present invention. This bonding pad structure is similar to the one shown in FIG. 2A except that it has another copper layer 315 firmly attached to the copper pad 310 by a plating operation. In this embodiment, the shape of the copper layer 315 is a circular plate that is located on top of the central region of the copper pad 310 by another plating operation. This copper layer 315 is equivalent to a protrusion extending downwards from the flat surface of the copper pad 310. As a result, a crack initiated at the edge of the copper pad 310 can not grow across the copper pad's surface without encountering an obstacle caused by the protrusion of the copper layer 315. Specifically, as shown in FIG. 3B, a crack growth route 324 in this embodiment has to be adjacent and parallel to a non-flat surface defined by the surface of the copper layer 315 and the remaining surface of the copper pad 310, and the multiple turns along the growth route 324 make it more difficult for a crack initiated on the edge of the copper pad (e.g., due to oxidization) to grow as it can in a conventional bonding pad structure. Consequently, the life expectancy of the solder joint 350 can be substantially longer than the solder joint 250 shown in FIG. 2B.

Referring again to FIG. 3A, the introduction of the copper layer 315 also helps to accumulate more solder paste on the peripheral edge 322 of the copper pad 310 and thereby increase the thickness of the solder layer near these edges 322. As a result, it is less likely that the copper pad surface will be exposed, oxidized and then turned into a crack initiation point when the substrate 305 goes through various thermal excursions as part of the substrate fabrication and package assembly process, e.g., solder pre-coating on the top and bottom sides of the substrate and underfill curing.

Figure 4A:
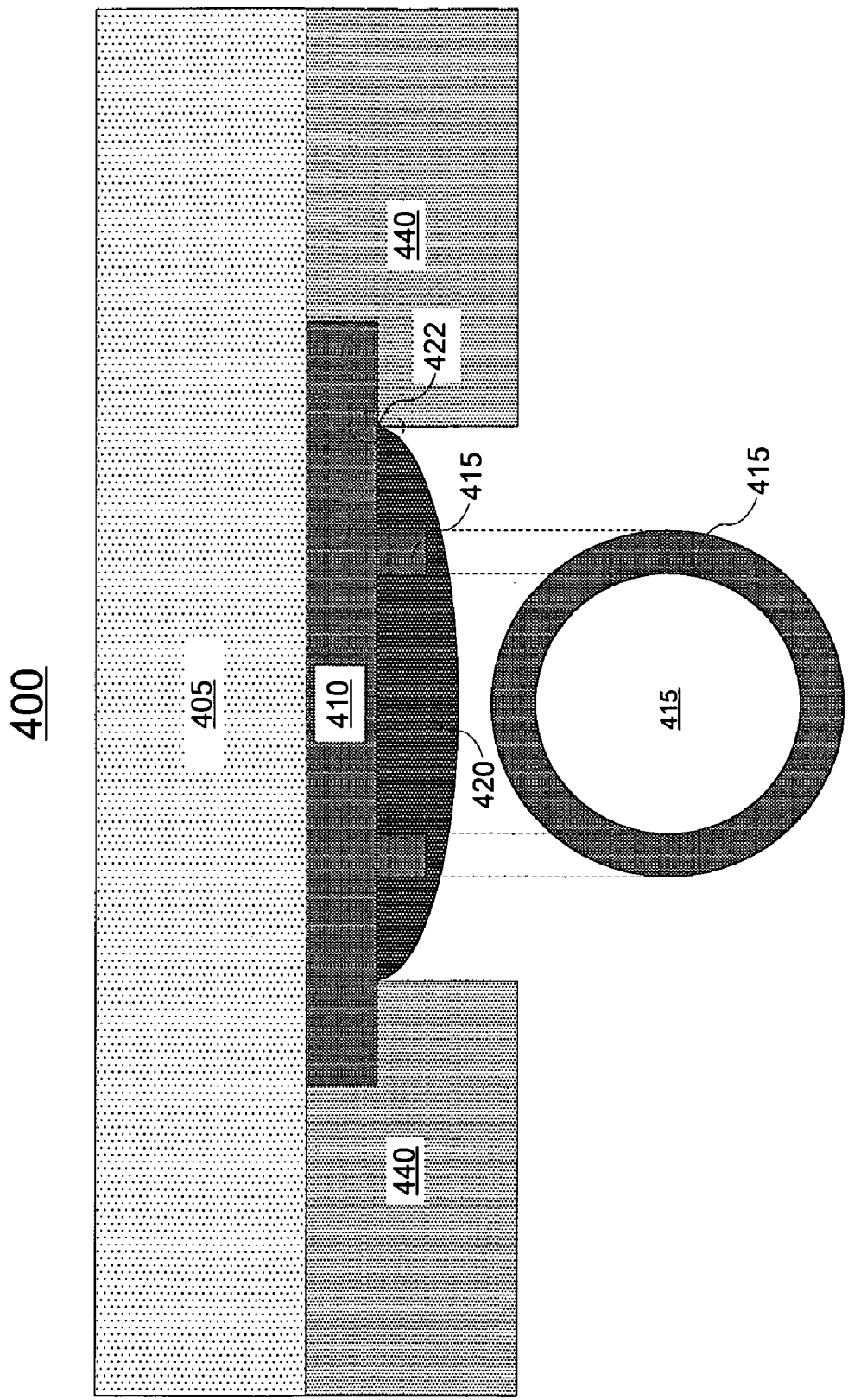
FIGS. 4A and 4B are enlarged cross-sectional views of a bonding pad structure at the bottom side of a substrate according to a second embodiment of the present invention.
Figure 4B:
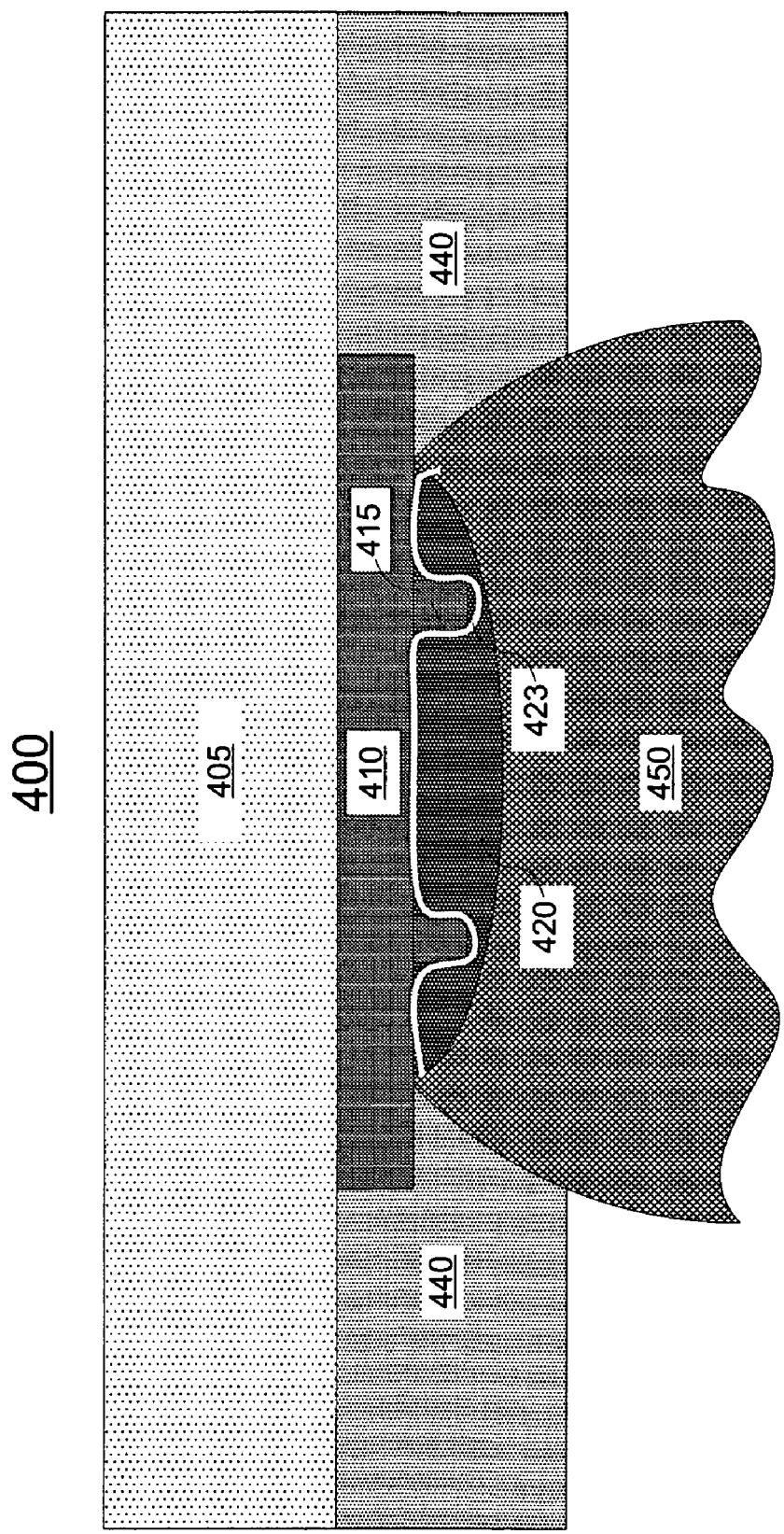

FIG. 4A is an enlarged cross-sectional view of a bonding pad structure 400 at the bottom side of a substrate 405 according to a second embodiment of the present invention. In this case, the circular copper layer 315 shown in FIG. 3A is replaced with an annular copper ring 415 and a solder layer 420 covers the copper ring 315. The annular ring may likewise be formed by a plating operation. FIG. 4B depicts a potential crack growth route 423 having eight right-angle turns along the route, which makes it even more unlikely that any crack initiated on the edge of the copper pad 410 would completely disconnect the solder joint 450 from the copper pad 410.

It will be appreciated by one skilled in the art that the features shared by the copper layer 315 (FIG. 3A) and the copper ring 415 (FIG. 4A) are that they disrupt a continuous and smooth crack growth route found on the surface of a conventional bonding pad (e.g., the crack 237) by introducing multiple sharp-angle turns into the crack growth route and that they increase the area of the connection between the copper layers and the solder joint. As a result, the durability of the copper-to-solder joint connection is significantly increased. In general, any bonding pad structure having a rugged (i.e., non-planar) contact interface that is covered with a layer of solder will demonstrate improved durability. Preferably, the increase in surface area of the connection between the copper layer(s) and the solder joint should be at least 3% and more preferably at least 6%. As shown in FIGS. 3A, 3B, 4A and 4B, the rugged contact interface can be made by attaching an extra element to an originally flat bonding pad. Alternatively, the rugged contact interface can be made by modifying the process for forming the bonding pad so as to produce a roughened surface, or form pits in the bonding pad surface or protuberances extending outward from the bonding pad. There are many choices for the exact shape of the extra element or the pit or protuberance. For example, it can be circular, oval, or polygonal. There is no special requirement for the composition of the solder paste deposited on the bonding pad and a typical one is eutectic solder.

Figure 5:
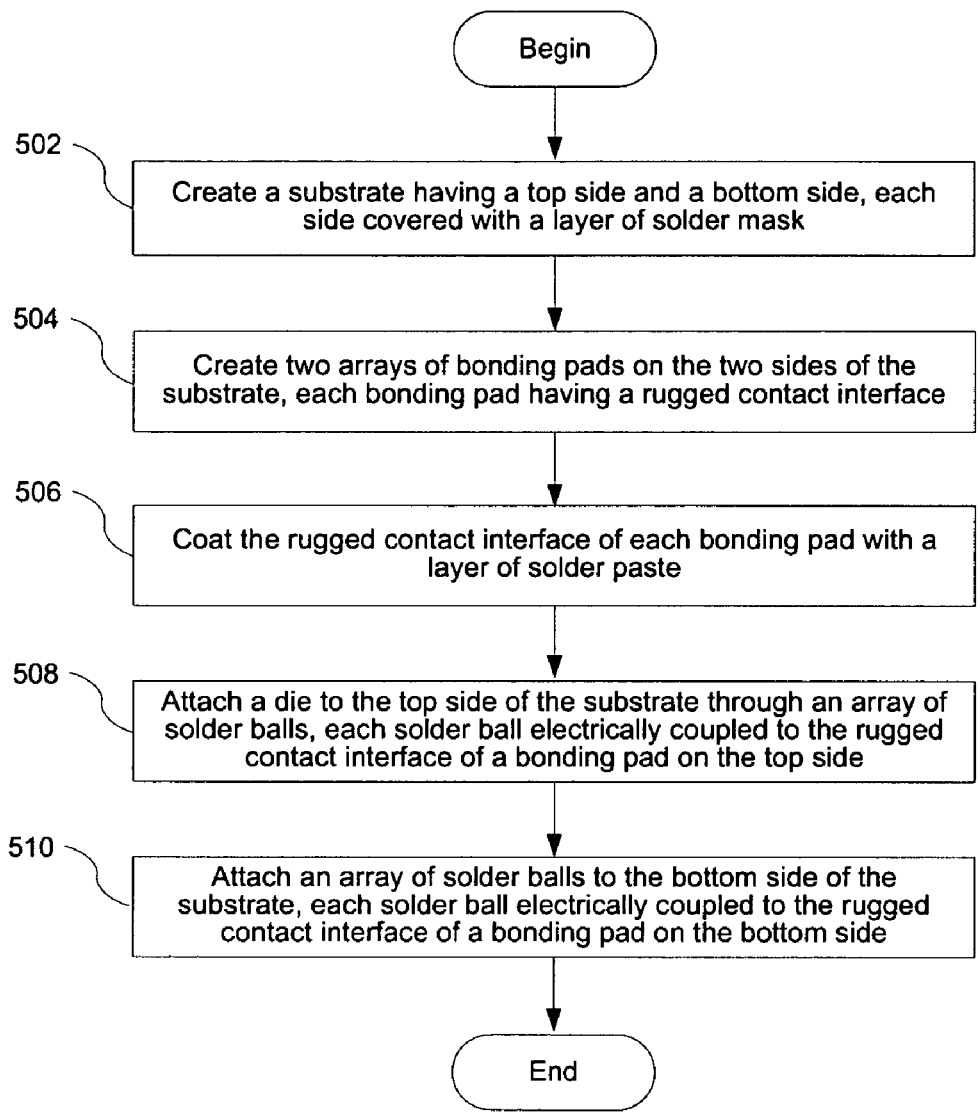
FIG. 5 is a flowchart illustrating the process of creating a BGA package according to one embodiment of the present invention.

FIG. 5 is a flowchart illustrating the process of creating a BGA package that has bonding pad structures according to one embodiment of the present invention. The process begins at step 502 with creating a substrate having a top side and a bottom side. The substrate typically includes a substrate core, a plurality of insulation layers and a plurality of conductive layers and two layers of solder mask, one covering the top side and the other covering the bottom side of the substrate. The solder mask layers on the two sides of the substrate are then etched out at step 504 at selected locations to expose the embedded conductive layers and create two arrays of bonding pads, one array on the top side and the other array on the bottom side. In at least the array of bonding pads on the bottom side and optionally in both arrays, each of the bonding pads has a rugged contact interface which may be created by attaching an extra element to the surface of each bonding pad. The rugged surface may be formed by plating an additional conductive layer on the bonding pad. Alternatively, pits or protuberances may be formed in the bonding pad. To prevent the bonding pads from being oxidized, the rugged contact interface of each bonding pad is coated at step 506 with a layer of solder paste, e.g., the eutectic solder. Next, at step 508, a semiconductor die is attached to the top side of the substrate through an array of solder joints, each solder joint electrically coupled to the contact interface of one bonding pad on the top side. Finally, at step 510, another array of solder balls is attached to the array of bonding pads on the bottom side of the substrate to create a BGA package. The process may include some additional steps such as injecting and curing underfill material into the space between the semiconductor die and the top side of the substrate, encapsulating the package with an encapsulant (e.g., epoxy) and attaching a heat spreader to the top side of the substrate. The BGA package coming out of this process can then be attached to a printed wiring board to create an electronic application.

The foregoing description, for purpose of explanation, has been made with reference to specific embodiments. However, the illustrative embodiments described above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. An electronic package, the package comprising:
   a substrate having a top side and a bottom side;
   a semiconductor die attached to a first array of bonding pads on the top side of the substrate; and
   an array of solder balls attached to a second array of bonding pads on the bottom side of the substrate;
   wherein at least one bonding pad in the second array has a rugged contact interface that is coated with a layer of solder,
   wherein the rugged contact interface includes at least one protuberance or one pit or both.

2. The package of claim 1 further comprising:
   a second array of solder joints interconnecting the semiconductor die and the first array of bonding pads;
   an underfill layer between the semiconductor die and the top side of the substrate; and an encapsulant covering the semiconductor die and the top side of the substrate.

3. The package of claim 1, wherein the rugged contact interface is formed by a conductive pad and a conductive element stacked on the conductive pad.

4. The package of claim 3, wherein the conductive pad and the conductive element are made of copper.

5. The package of claim 3, wherein the conductive element is in a shape of one selected from the group consisting of circle, oval, polygon, and annular ring.

6. The package of claim 1, wherein the rugged contact interface is formed by forming pits or protuberances in the bonding pad.

7. The package of claim 1, wherein each bonding pad in the first array has a rugged contact interface.

8. The package of claim 1, wherein the layer of solder is made of eutectic solder.

9. An electronic package, the package comprising:
   a substrate having a top side and a bottom side;
   a semiconductor die attached to a first array of bonding pads on the top side of the substrate; and
   an array of solder balls attached to a second array of bonding pads on the bottom side of the substrate;
   wherein at least one bonding pad in the second array has at least one protuberance or one pit or both forming a non-planar contact surface,
   wherein a cross-sectional view of the bonding pad corresponding to the non-planar contact surface includes multiple sharp-angle turns that cause a substantial increase of the surface area of the bonding pad when compared with a bonding pad of same size having a flat contact surface.

10. The electronic package of claim 9, wherein the at least one bonding pad includes a circular copper plate firmly attached to a portion of a flat surface of a copper pad.

11. The electronic package of claim 9, wherein the at least one bonding pad includes a circular copper ring firmly attached to a flat surface of a copper pad.

12. The electronic package of claim 9 further comprising:
   a second array of solder joints interconnecting the semiconductor die and the first array of bonding pads;
   an underfill layer between the semiconductor die and the top side of the substrate; and
   an encapsulant covering the semiconductor die and the top side of the substrate.

13. The electronic package of claim 9, wherein the non-planar contact surface comprises a conductive pad and a conductive element stacked on the conductive pad.

14. The electronic package of claim 13, wherein the conductive pad and the conductive element are made of copper.

15. The electronic package of claim 13, wherein the conductive element is in a shape of one selected from the group consisting of circle, oval, polygon, and annular ring.

\* \* \* \* \*